Figure 1:
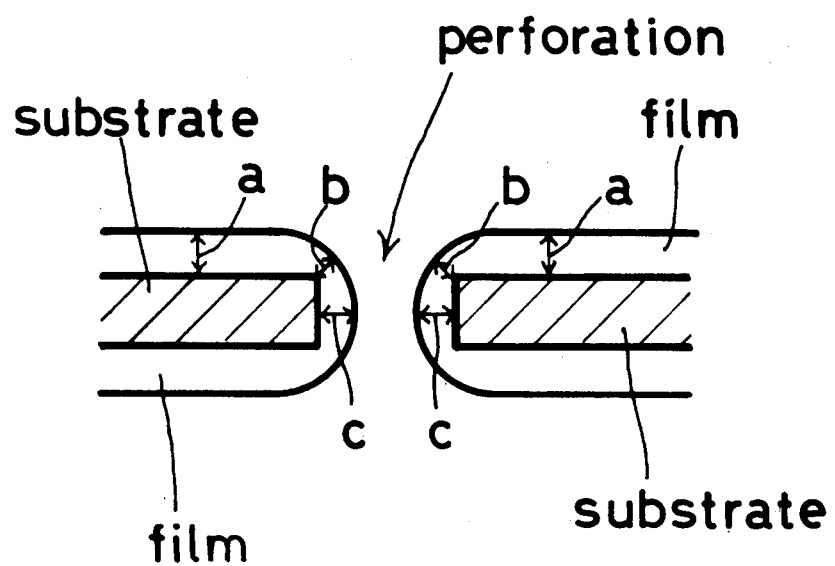

United States Patent [19]

Okado et al.

[11] 4,238,385

[45] Dec. 9, 1980

[54] COATING COMPOSITION FOR FORMING INSULATING FILM ON ELECTROCONDUCTIVE SUBSTRATE FOR PRINTED CIRCUITS AND METHOD THEREFOR

[75] Inventors: Yasuomi Okado; Ken Nishizaki, both of Narashino; Akinobu Tanaka, Mito, all of Japan

[73] Assignees: Nippon Telegraph and Telephone Public Corporation; Shinto Paint Co., Ltd., both of Japan

[21] Appl. No.: 66,822

[22] Filed: Aug. 14, 1979

[30] Foreign Application Priority Data

Aug. 17, 1978 [JP] Japan .............................. 53-100781

[51] Int. Cl.³ .............................................. C08L 63/00
[52] U.S. Cl. ............................. 260/37 EP; 204/181 C
[58] Field of Search ................ 260/37 EP; 204/181 C

[56] References Cited

U.S. PATENT DOCUMENTS

| | | | |
|---|---|---|---|
| 3,450,655 | 6/1969 | Spiller | 260/37 EP |
| 3,869,366 | 3/1975 | Suzuki et al. | 204/181 C |
| 4,007,154 | 2/1977 | Schimmel et al. | 260/37 EP |

*Primary Examiner*—Lewis T. Jacobs
*Attorney, Agent, or Firm*—Wenderoth, Lind & Ponack

[57] ABSTRACT

This invention is directed to coating compositions for electrocoating electroconductive substrates for printed circuits comprising a pigment-containing finely divided synthetic resin powder in which the resin comprises an epoxy resin, and the pigment comprises pigments with 2–10 weight parts of finely divided silica, admixed with a water-dilutable cationic resin, and to methods of utilizing the composition for forming an insulating film on an electroconductive substrate.

1 Claim, 1 Drawing Figure

COATING COMPOSITION FOR FORMING INSULATING FILM ON ELECTROCONDUCTIVE SUBSTRATE FOR PRINTED CIRCUITS AND METHOD THEREFOR

The present invention relates to a coating composition for forming a flat and smooth insulating film having excellent physical properties, such as adhesiveness, resistance to high voltage, etc. on an electroconductive substrate for printed circuits, such as steel plate, aluminum plate, etc.

In recent years, in forming circuits for telephone exchange apparatus, sound apparatus, computers, or other apparatus having various concentrated circuits, there is a strong and growing demand for improving the dimensional stability, mechanical strength, heat radiation, economy, etc. of these circuits and substrates. As such substrates for printed circuits, it has been customary to use plastics such as glass fiber-reinforced epoxy resins, phenol resins, etc. Although these substrates are light in weight, they have not been wholly satisfactory as regards dimensional stability, mechanical strength, heat radiation, etc. Such defects can be overcome by using electroconductive substrates such as steel plate, aluminum plate, etc. in place of plastic plates. However, since such plates are electrically conductive, they cannot be used, as they are, for printed circuits. Accordingly, the question is how to give insulating properties to such substrates. To make electroconductive substrates insulating, one can think of coating the substrates with an insulating coating composition. But, to obtain a coated film having a thickness to give sufficient insulating properties throughout the substrate by a usual coating method, it is necessary to repeat coating and baking three to five times. Moreover, it is difficult to control the thickness of the coated film uniform, and also there is an extreme difficulty in insulating perforated portions of the substrate provided for circuit printing. To improve such usual coating methods, there are powder coating methods such as fluidized immersion method, electrostatic coating method, etc. Such coating methods can give indeed a necessary film thickness in one single step, but gives an insufficient coating around the perforated portions. In addition, since such methods use dry powder, there is a danger of explosion and a labor sanitation problem.

Accordingly, an object of the present invention is to provide a coating composition that can form a coated film having excellent insulating properties on the surfaces of an electroconductive substrate for printed circuits which is excellent in dimensional stability, mechanical strength, heat radiation, etc., and to provide a method of forming such a coated film on the surfaces of such a substrate.

Other objects of this invention will become apparent from the following explanation which will be made by referring partly to FIG. 1 which illustrates the edge covering ratio at a perforated portion and the inner wall covering ratio.

In applying an insulating film on the surfaces of an electroconductive substrate, such as a steel plate or an aluminum plate, substituted for the above-mentioned plastic substrate, we have found that the following composition and method of forming coated films can solve the above-mentioned problems.

Namely, the present invention consists in a coating composition for forming an insulating film on an electroconductive substrate for printed circuits, composed of a pigment-containing finely divided synthetic resin powder and a water-dilutable cationic resin, characterized in that (i) the weight ratio of said finely divided powder to said cationic resin is 0.5-20 to 1,
(ii) said finely divided powder is composed of 50-80 weight poarts of a vehicle comprising an epoxy resin (A) having an epoxy equivalent of 400-2400 and a hardener, and 50-20 weight parts of said pigment (B), 2-10 weight parts in said pigment weight parts being finely divided silica particles having a particle diameter not larger than 100 m$\mu$, and
(iii) said water-dilutable cationic resin is produced from an addition product of an epoxy resin having an epoxy equivalent of 200-2400 and a primary or secondary amine by water-solubilizing said addition product with an acid compound.

Also, the present invention consists in a method of forming an insulating film on an electroconductive substrate for printed circuits, which comprises immersing an electroconductive substrate and an opposing electrode thereof in a bath containing the above-mentioned coating composition; impressing a direct current voltage between the substrate and the opposing electrode, with said substrate taken as the cathode; and depositing said coating composition on said substrate.

The use of the above-mentioned coating composition and method according to the present invention gives no danger of dust explosion and provides a wholly uniform insulating film with a thickness necessary and sufficient for insulation in one single step, with the coating around perforated portions and on side surfaces being satisfactory.

As previously mentioned, the pigment-containing synthetic resin powder used in the present invention is composed of a vehicle comprising an epoxy resin (A) having an epoxy equivalent of 400-2400 and a hardener, and a pigment. When the epoxy equivalent of the epoxy resin used herein is less than 400, the formed film will have poor adhesiveness, and will be liable to cause blocking and formation of agglomerated particles, so that the quality of the coated film can be impaired. In the case of a thick film, if the epoxy equivalent exceeds 2400, the physical properties can be impaired. As the above-mentioned hardener, there is used a hardener which can give a necessary film thickness of 100-150$\mu$ in one single step, without injuring the excellent insulating properties of the above-mentioned epoxy resin and which does not leave pinholes, voids and cracks. Such hardener and epoxy resin can be selected from known ones. Blocked polyisocyanates are preferable as the hardener, and generally, 10-50 weight parts hardener can be used for 100 weight parts epoxy resin. The vehicle composed of such an epoxy resin and hardener is used in the ratio of 50-80 weight parts, preferably 50-70 weight parts, for 100 weight parts of the pigment-containing synthetic powder. If the vehicle is used in an amount less than 50 weight parts, the adhesiveness of the formed insulating film to the electroconductive substrate for printed circuits will become insufficient. If the vehicle is used in an amount more than 80 weight parts, the adhesiveness around the perforated edge portions of the electroconductive substrate for printed circuits is impaired and the thickness of the coated film becomes little so that the insulating properties become insufficient.

The pigments used in combination with the above-mentioned vehicle are those used in the usual coating compositions, such as titanium oxide, carbon black, red iron oxide, etc. Such pigments are used in the ratio of 50-20 weight parts for 50-80 weight parts vehicle, but in the present invention, fine particle silica having a particle diameter not larger than 100 mμ constitutes 2-10 weight parts in the pigment weight parts as an indispensable component. The most preferable amount of the silica to be used is 3-7 weight parts. If such silica is used in an amount less than 2 weight parts, the insulating properties of the film at edge portions of the substrate become poor. If the amount of the silica exceeds 10 weight parts, the powder upon producing the fine powder cannot be kneaded and pulverized uniformly because of a small apparent specific gravity of the silica, so that a wide variation is liable to occur between lots. If the particle diameter of the silica exceeds 100 mμ, the baked film does not become thixotropic so that such a particle diameter is not desirable. We have found that, when silica is used as a component of the pigment, its viscosity upon baking the coated film become thixotropic in a flow state, so that no gap occurs at the edge portions, etc. and therefore the withstanding voltage is greatly increased.

The pigment-containing finely divided synthetic resin powder, after kneading, is pulverized in the usual way into fine particles having an average particle diameter of 2-20μ. Within the range in which the object of the present invention is not injured, it is possible to mix the synthetic resin powder partly with other resins such as polyester resins, phenol resins, epoxy-urethane resins, urethane resins, petroleum resins, etc.

The water-dilutable cationic resins used in the present invention act on the pigment-containing finely divided resin powder to give it electrophoretic properties in the bath upon carrying out electrodeposition coating. Such water-dilutable cationic resins are preferably produced from an epoxy resin with an epoxy equivalent of 200-2400 having an affinity to the above-mentioned pigment-containing finely divided synthetic resin powder. If the epoxy equivalent is less than 200, the insulating properties of the insulating film obtained by baking the coated film after electrodeposition coating, become poor. If the epoxy equivalent exceeds 2400, there is a tendency that the water-dilutability become poor and the storing stability of the coating composition in a water-dispersed state becomes poor. To make the epoxy resin water-dilutable, a primary or secondary amine is added to it, and the resulting addition product is neutralized with an acid compound. Within the range in which the stability and the object of the coating composition of the present invention are not injured, the above-mentioned epoxy resins can be mixed with polyether-ester epoxy resins, urethane-bonded epoxy resins, acrylic acid epoxy ester resins, fatty acid epoxy ester resins, polybutadiene-modified epoxy resins, etc., and also can be mixed with epoxy resin hardeners such as melamine resins, isocyanurates, blocked compounds of isocyanates, acrylic acid amide resins, etc.

The coating compositions of the present invention can be formed into an electrodeposition bath by dispersing or dissolving the above-mentioned pigment-containing finely divided synthetic resin powder and water-dilutable cationic resin in water in the ratio by weight of 0.5-20 to 1. In this case, the electrodeposition bath desirably contains solid matter in an amount of 5-30 weight %, preferabley 10-20 weight %.

Upon forming an electrodeposited film on the electroconductive substrate for printed circuits by using the coating composition bath of the present invention, the article to be coated (electroconductive substrate) is immersed into the bath together with a non-erosive or non-rusting rod or plate, such as, of carbon or stainless steel, used as the opposing electrode. At this time, it is preferable that, on each side of the article to be coated, one opposing electrode should be arranged to face said article. It is preferable that the area of each of the opposing electrodes is not larger than 1 in comparison with the opposing area of the article to be coated.

To increase the resistance to erosion of the article to be coated and its adhesiveness to the film to be formed, the article to be coated may be subjected to a suitable pretreatment, such as phosphate treatment.

Upon carrying out electrodeposition, after the article to be coated and opposing electrodes are immersed, they are preferably caused to stand for more than 20 seconds, and thereafter electricity is turned on. This standing presumably contributes to giving an electric uniformity to the surfaces of the article to be coated, whereby the finish of the formed insulating film is improved. In place of this standing, the article to be coated may be sprayed with the bath liquid before immersing it into the bath.

Immediately after immersing the article to be coated and the opposing electrodes, or after causing them to stand, a direct current voltage is impressed, with the article to be coated taken as the cathode and the opposing electrodes as the anodes. The coating conditions are as follows:

Bath liquid temperature 20°-30° C., preferably 20°-25° C.,
Voltage: 100-400 v, preferably 150-300 v,
Time: 5-90 seconds, preferably 10-20 seconds.

The film thickness can be regulated by controlling the quantity of electricity.

The electrically coated article is then passed through the steps of water-washing, water-draining, and drying in the usual way, and is baked to harden the electrodeposited film. By this process, a smooth, uniform insulating film having a withstanding voltage of 1-3 KV can be formed on the electroconductive substrate for printed circuits.

By using the coating composition and method of the present invention, it is possible to form a uniform film having a voltage withstanding properties on the planes and numerous perforated portions of the electroconductive substrate for printed circuits, without impairing the demanded strict dimensional stability.

The present invention will be further explained in the following by examples, in which parts and percentages are by weight.

EXAMPLE 1

As a coating composition for forming an insulating film on a substrate for printed circuits, the following was supplied for testing.

(1) Preparation of the powder particles

Epoxy resin: Epikote 1007 (Shell Chemical Co.) 40.0 parts

Isocyanate hardener: EH-118-2 (Asahi Denka K.K.) 36.0 parts

Pigment-1: Titanium R-80 (Ishihara Sangyo K.K.) 21 parts

Pigment-2: Carbon MA-100 (Mitsubishi Chemical) 0.5 part

Pigment-3: Fine particle silica, AEROSIL 380 (Nippon Aerosil Co.) 2.5 parts

By the usual powder production method, the above-mentioned components were molten and kneaded in an extruder, and were pulverized by an impulse-type pulverizer to obtain powder particles having an average particle diameter of 12.5µ.

(2) Preparation of the water-dilutable cationic resin

Epikote 1001: 488 parts
Diethanolamine: 105 parts
Isopropyl alcohol: 250 parts

The above-mentioned components were caused to react at 80° C. for 3 hours under reflux to obtain a liquid resin. To 857 parts of the above cationic resin, 38 parts of glacial acetic acid and 5105 parts of deionized water were added, and the mixture was thoroughly stirred by a dissolver. Then, 5400 parts of the above-mentioned powder particles were added. After this mixture was mixed and dispersed for 30 minutes with a high-speed rotary homogenizer, the mixture was regulated until the solid matter reached 20% by diluting it with deionized water to produce 30,000 parts of a bath liquid of a powder electrodeposition coating composition.

In an electrodeposition vessel equipped with a stirrer, an iron phosphate-treated conductive substrate (250×200×0.8 mm) for printed circuits having many perforations, each 1 mm–3 mm in diameter, was immersed. On each side of the substrate, an opposing electrode made of stainless steel (250×200 mm) was immersed, and after 30 seconds of standing, electrodeposition was started.

The electrodeposition conditions were as follows:
Bath liquid temperature: 22° C.
Ratio of the electrode areas: $\ominus/\oplus = 1/1$
Distance between the electrodes: 15 cm
Voltage: 300 v
Time: 20 seconds After the electrodeposition, the substrate was washed with water and then baked. The baking conditions were as follows:
80° C. for 10 minutes,
temperature elevation from 80° C. to 200° C. in 15 minutes,
200° C. for 15 minutes.

The coated film thus obtained represented a uniform and beautiful appearance. The film thickness was 120µ. The test results of the coated film are shown in Table 1.

Comparative Example 1

The powder particles were prepared in the same way as in Example 1 from the following components:

| | |
|---|---|
| Epikote 1007 | 30 parts |
| Isocyanate hardener EH-118-2 | 27 parts |
| Pigment-1 Titanium CR-80 | 42 parts |
| Pigment-2 Carbon MA-100 | 1 part |

The average particle diameter was 14.2µ. The water-dilutable cationic resin used was the same as in Example 1. After the powder and the binder were regulated in the same way as in Example 1, the electrodeposition and baking were carried out in the same way as in Example 1. The result was that there was striking roughness on the coated surfaces, and the perforations of the substrate were partially filled up. The test results of the coated film are shown in Table 1.

TABLE 1

| | Measurement items | Example 1 | Comparative Example 1 | Designed values for industrial apparatus |
|---|---|---|---|---|
| | Film thickness | 120 µ | 110–140 µ | 100–130 µ |
| *1 | Surface roughness | uniform, 5 µ | non-uniform, 35 µ | less than 15 µ |
| *2 | Edge covering ratio at perforated portions | 75% | 23% | more than 50% |
| *3 | Inner wall covering ratio | 1.10 | 2.8 perforations partially filled up | less than 1.2 |
| *4 | Withstanding voltage | more than one minute at 2.5 KV | 3 seconds at 0.4 KV | one minute at 0.75 KV |

*1 Surface roughness:
A difference between protruded portions and depressed portions measured by means of a surface roughness meter (Kosaka K.K.)

*2 Edge covering ratio at perforated portions:
$\frac{b}{a} \times 100$ (%) in FIG. 1 determined by microscopic cross-sectional photographs.

*3 Inner wall covering ratio:
$\frac{c}{a} \times 100$ (%) in FIG. 1 determined by microscopic cross-sectional photographs.

*4 Breakdown voltage for the coated film in mercury (mercury method).

What we claim is:

1. A coating composition for forming an insulating film on an electroconductive substrate for printed circuits, composed of a pigment-containing finely divided synthetic resin powder and a water-dilutable cationic resin, characterized in that
   (i) the weight ratio of said finely divided powder to said cationic resin is 0.5–20 to 1,
   (ii) said finely divided powder is composed of 50–80 weight parts of a vehicle comprising an epoxy resin (A) having an epoxy equivalent of 400–2400 and a hardener, and 50–20 weight parts of a pigment (B), 2–10 weight parts in said pigment weight parts being finely divided silica particles having a particle diameter not larger than 100 mµ, and
   (iii) said water-dilutable cationic resin is produced from an addition product of an epoxy resin having an epoxy equivalent of 200–2400 and a primary or secondary amine by water-solubilizing said addition product with an acid compound.

* * * * *